United States Patent
Wei et al.

(10) Patent No.: US 7,719,060 B2
(45) Date of Patent: May 18, 2010

(54) TENSILE STRAIN SOURCE USING SILICON/GERMANIUM IN GLOBALLY STRAINED SILICON

(75) Inventors: Andy Wei, Dresden (DE); Karla Romero, Dresden (DE); Manfred Horstmann, Duerrrhoehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/112,288

(22) Filed: Apr. 30, 2008

(65) Prior Publication Data

US 2009/0108361 A1    Apr. 30, 2009

(30) Foreign Application Priority Data

Oct. 31, 2007    (DE) .................... 10 2007 052 053

(51) Int. Cl.
*H01L 29/78*    (2006.01)
*H01L 21/336*    (2006.01)

(52) U.S. Cl. ............... 257/368; 257/19; 257/63; 257/219; 257/E21.335; 257/E29.255; 438/285; 438/275

(58) Field of Classification Search ............ 257/19, 257/63, 65, 195, 219, 223, 229, 609, 368, 257/E21.409, E29.255, E31, E21.335, E21.429, 257/E21.43, E21.431, E21.438, E29.055, 257/E29.056, E29.286; 438/36, 37, 49, 87, 438/93, 285, 275, 197

See application file for complete search history.

(56) References Cited

U.S. PATENT DOCUMENTS

| 6,963,078 | B2 | 11/2005 | Chu .............................. 257/19 |
| 2007/0029553 | A1* | 2/2007 | Ozturk et al. .................. 257/63 |
| 2007/0231983 | A1 | 10/2007 | Shifren et al. ............... 438/197 |
| 2008/0023692 | A1* | 1/2008 | Wirbeleit et al. .............. 257/19 |

FOREIGN PATENT DOCUMENTS

WO    WO 03/105233 A1    12/2003

OTHER PUBLICATIONS

Translation of Official Communication from German Patent Office for German Patent Application No. 10 2007 052 053.2 dated Jul. 17, 2008.

* cited by examiner

*Primary Examiner*—Victor A Mandala
*Assistant Examiner*—Whitney Moore
(74) *Attorney, Agent, or Firm*—Williams, Morgan & Amerson, P.C.

(57) ABSTRACT

By embedding a silicon/germanium mixture in a silicon layer of high tensile strain, a moderately high degree of tensile strain may be maintained in the silicon/germanium mixture, thereby enabling increased performance of N-channel transistors on the basis of silicon/germanium material. In other regions, the germanium concentration may be varied to provide different levels of tensile or compressive strain.

28 Claims, 4 Drawing Sheets

TENSILE STRAIN SOURCE USING SILICON/GERMANIUM IN GLOBALLY STRAINED SILICON

BACKGROUND OF THE INVENTION

1. Field of the Invention

Generally, the present disclosure relates to the formation of integrated circuits, and, more particularly, to the formation of transistors having strained channel regions by using stress-inducing sources, such as globally strained silicon substrates and the like, to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode located close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region is a dominant factor determining the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, typically an oxide-based dielectric, has to be reduced when reducing the gate length, wherein a reduced thickness may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has therefore been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating uniaxial tensile strain in the channel region along the channel length direction for a standard crystallographic orientation increases the mobility of electrons, which, in turn, may directly translate into a corresponding increase in the conductivity. On the other hand, uniaxial compressive strain in the channel region for the same configuration as above may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

In some approaches, external stress created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like, into the channel region to create the desired strain therein. Thus, for different transistor types, differently stressed overlayers have to be provided, which may result in a plurality of additional process steps, wherein, in particular, any additional lithography steps may significantly contribute to the overall production costs. Moreover, the amount of stress-inducing material, and in particular the intrinsic stress thereof, may not be arbitrarily increased without requiring significant design alterations. For example, the degree of tensile stress in corresponding portions of the dielectric layer formed above an N-channel transistor may presently be limited to approximately 1.5 GPa (Giga Pascale), while the amount of tensilely stressed material may have to be reduced in sophisticated transistor geometries including reduced distances of neighboring transistor elements in device areas of high packing density, and thus new developments of respective deposition techniques may be required for further improving performance of N-channel transistors on the basis of stressed overlayers. On the other hand, significantly higher compressive stress levels may be provided for P-channel transistors by presently established techniques, thereby creating an imbalance with respect to enhancing performance of NMOS and PMOS transistors.

In still a further approach, a substantially amorphized region may be formed adjacent to the gate electrode at an intermediate manufacturing stage, which may then be re-crystallized in the presence of a rigid layer formed above the transistor area. During the anneal process for re-crystallizing the lattice, the growth of the crystal will occur under stress conditions created by the overlayer and result in a tensilely strained crystal. After the re-crystallization, the sacrificial stress layer may be removed, wherein, nevertheless, a certain amount of strain may be "conserved" in the re-grown lattice portion. This effect is generally known as stress memorization. Although this mechanism provides a promising technique for enhancing performance of N-channel transistors, a highly controlled application thereof is difficult as the exact mechanism is not yet understood.

In other approaches, a strained silicon base material may be provided by, for instance, growing silicon on a relaxed silicon/germanium (Si/Ge) alloy, which has a greater lattice constant compared to natural silicon, thereby resulting in a biaxial tensile strain in the re-grown silicon material, which may thus enable enhancement of P-channel transistors and N-channel transistors due to the biaxial nature of the strain. A certain imbalance with respect to strain-inducing mechanisms may nevertheless exist, since many efficient strain-inducing mechanisms are available for PMOS transistors, such as embedded strained silicon/germanium material, stressed contact etch stop layers of very high intrinsic compressive stress and the like, and, therefore, respective engineering techniques may be desirable to specifically enhance performance of NMOS transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to methods and semiconductor devices in which a highly efficient strain-inducing mechanism is contemplated, in which a globally strained silicon-containing semiconductor layer is provided which may be used as base material for forming therein and thereon transistor elements. On the basis of the globally strained semiconductor material, an efficient adjustment of the overall transistor characteristics may be accomplished by using silicon/germanium material, i.e., a mixture of these components so as to obtain a crystalline material having an adjustable lattice constant. The fraction of germanium in the corresponding silicon/germanium mixture may thus be appropriately selected on the basis of the overall global strain in the silicon-containing semiconductor layer in order to individually adjust current drive capability of transistor elements, such as of an NMOS transistor. To this end, the silicon/germanium mixture may be provided in appropriate portions of the N-channel transistor so as to obtain a reduced resistance thereof due to the intrinsically increased electron mobility of silicon/germanium material, while, additionally, tensile strain may be provided in the silicon/germanium mixture, thereby even further enhancing the overall drive current capability of the N-channel transistor. Thus, in the silicon channel region of the transistor, the high desired tensile strain may be obtained on the basis of the globally biaxial strain, wherein, locally, silicon/germanium material may be provided to enhance electron mobility due to the intrinsic material characteristics and a significant tensile strain, thereby, in total, increasing the transistor performance compared to using only highly strained silicon material. On the other hand, according to the principles disclosed herein, an efficient uniaxial tensile or compressive strain component may additionally be achieved by appropriately positioning the silicon/germanium mixture with an appropriately selected germanium fraction, thereby even further enhancing the transistor performance while also providing the possibility of individually adjusting the characteristics of N-channel transistors and P-channel transistors.

One illustrative method disclosed herein comprises providing a silicon-containing semiconductor layer above a substrate, wherein the silicon-containing semiconductor layer has an internal tensile strain. Furthermore, the method comprises forming a gate electrode structure for an N-channel transistor above the portion of the silicon-containing semiconductor layer and forming a tensile silicon/germanium mixture laterally adjacent to the gate electrode structure of the N-channel transistor.

Another illustrative method disclosed herein comprises forming an N-channel transistor in a first device region comprising a tensilely strained silicon-containing layer. The method further comprises providing a tensile silicon/germanium mixture in the N-channel transistor to adjust a drive current capability of the N-channel transistor.

One illustrative semiconductor device disclosed herein comprises a tensile silicon-containing semiconductor layer formed above a substrate and an N-channel transistor that is formed in and above the tensile silicon-containing layer. Finally, the semiconductor device comprises a tensile silicon/germanium mixture provided in a portion of the N-channel transistor.

BRIEF DESCRIPTION OF THE DRAWINGS

The disclosure may be understood by reference to the following description taken in conjunction with the accompanying drawings, in which like reference numerals identify like elements, and in which:

FIG. 1b schematically illustrates a graph which depicts experimental data representing an internal strain level of silicon/germanium mixtures formed on a silicon material having high tensile strain as, for instance, illustrated in FIG. 1a;

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides methods and devices in which highly efficient strain-inducing mechanisms for providing a strained semiconductor material may be combined with concepts of appropriately incorporating silicon/germanium mixtures or alloys in order to further enhance the overall transistor characteristics, such as N-channel transistors. As previously explained, a plurality of strain-inducing mechanisms have been established to locally provide a certain degree of stress at specific transistor areas in order to obtain a desired degree of strain in the channel region of the transistor under consideration. In this respect, the term "local" is to be understood such that the respective strain-inducing mechanism may be individually provided at transistor level, while also offering the possibility of covering extended device regions. For example, the incorporation of a silicon/germanium alloy in the drain and source regions of a P-channel transistor may be accomplished in a highly local manner, thereby obtaining a high degree of compressive strain in the adjacent channel region of the P-channel transistor. On the other hand, a "global" strain may be provided in that a basic semiconductor layer in which N-channel transistors and P-channel transistors are to be formed is initially provided so as to have a high internal strain, which may therefore also prevail in respective channel regions still to be formed in the basic strained semiconductor layer. For example, by providing an appropriate technique, as will be explained in more detail later on with reference to FIGS. 1f-1g, a high degree of biaxial tensile strain may be created in a silicon layer, thereby providing enhanced conditions for the formation of P-channel transistors and N-channel transistors due to the biaxial nature of the tensile strain. However, since very efficient further strain-inducing mechanisms may be available for P-channel transistors, for instance, the deposition of a dielectric material having a high internal compressive stress, it may nevertheless be highly desirable to provide further mechanisms for individually enhancing the performance of N-channel transistors, as is also discussed above. For this purpose, the principles disclosed herein relate to techniques in which silicon/germanium material may be advantageously used for enhancing the characteristics of N-channel transistors and, if desired, for P-channel transistors, while, in conventional techniques, a corresponding enhancement of N-channel transistors on the basis of silicon/germanium material may not have been contemplated or may have resulted in reduced gain of device performance, since typically silicon/germanium material when grown on silicon material in drain and source regions provides a compressive strain therein. The techniques disclosed herein, however, enable the incorporation of a silicon/germanium material in a silicon material, which may have an initial tensile strain, wherein an appropriately selected germanium concentration may nevertheless result in a desired tensile strain in the silicon/germanium area, thereby combining the enhanced electron mobility of silicon/germanium material with a certain amount of tensile strain thereby resulting in overall transistor enhancement in specific device portions, such as a portion of the drain and source regions, while nevertheless providing the high degree of tensile strain in the silicon channel region of the N-channel transistor. Moreover, in some illustrative aspects, a uniaxial strain component may be added to the biaxial basic strain conditions, thereby contributing to overall enhanced strain conditions in the channel region, even for N-channel transistors. Consequently, since the fraction of germanium in a silicon/germanium mixture may be efficiently adjusted, for instance, on the basis of epitaxial growth techniques, ion implantation and the like, the transistor characteristics may be individually adapted, thereby enabling a more efficient balancing of N-channel transistor and P-channel transistor performance.

Figure 1A:
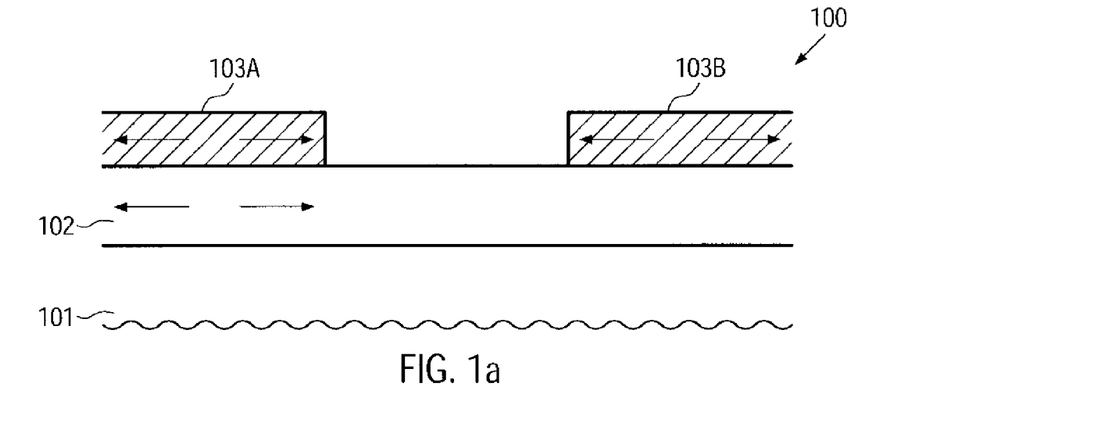
FIG. 1a schematically illustrates a cross-sectional view of a substrate having formed thereon a strained semiconductor layer on which are formed various portions of the silicon/germanium mixture with a differing amount of germanium, thereby adjusting an internal strain of the silicon/germanium mixture depending on the tensile strain of the underlying semiconductor layer according to illustrative embodiments.

FIG. 1a schematically illustrates a portion of a semiconductor device 100 which may represent a device in an early manufacturing stage or a test device for obtaining measurement values with respect to internal strain levels for silicon/germanium mixtures of different concentrations, as will be described later on in more detail. The semiconductor device 100 may comprise a substrate 101, which may represent any appropriate carrier material, such as a silicon substrate, a silicon-on-insulator (SOI) substrate and the like. Formed above the substrate 101 is a silicon-containing semiconductor layer 102 which may comprise a high internal tensile strain which may be created by any appropriate technique, as will be described, for instance, later on with reference to FIGS. 1e-1f. For example, the silicon-containing semiconductor layer 102 may have an internal tensile strain level of several hundred MPa to approximately 1.5 GPa or higher. In one embodiment, the layer 102 may represent a silicon layer having a (100) surface crystallographic orientation, that is, a crystallographic axis corresponding to a <100> direction may extend substantially perpendicular to the surface of the layer 102. In this case, a biaxial strain in the layer 102 may provide enhancement of transistor characteristics when respective transistor channels are oriented along a <110> direction or a direction equivalent thereto.

The semiconductor device 100 may further comprise a plurality of silicon/germanium mixtures 103A, 103B which may be formed on the silicon-containing semiconductor layer 102 and may comprise different amounts of germanium. For example, the silicon/germanium mixture 103A may comprise approximately 10 atomic percent germanium, while the mixture 103B may comprise approximately 30 atomic percent germanium. For a specified strain level in the underlying silicon-based layer 102 and for the different fractions of germanium in the regions 103A, 103B, the effective internal strain thereof may be tensile and compressive, respectively. That is, if the internal strain level of the silicon layer 102 corresponds to a level that may, for instance, require approximately 20 percent germanium within a silicon/germanium mixture in order to obtain a silicon/germanium crystal with a substantially non-strained lattice, the region 103A having a lower germanium content compared to this "neutral" germanium content may thus have an internal tensile strain, however, with a reduced amount compared to the strain in the silicon layer 102. Similarly, the strained state of the silicon layer 102 may not suffice to cause a strain-neutral growth of the region 103B, when a significantly higher germanium fraction may be used, thereby resulting in an overall compressive strain in the region 103B.

It should be appreciated that the regions 103A, 103B may be formed on the basis of well-established epitaxial growth techniques, wherein corresponding portions of the layer 102 may be masked during the selective epitaxial growth steps performed on the basis of different germanium concentrations. Thus, a plurality of different silicon/germanium regions 103A, 103B may be formed in order to obtain the plurality of different strain states for quantitatively estimating the relationship between the internal strain level in the silicon layer 102 and the internal strain levels in the regions 103A, 103B. The various strain levels in the regions 103A, 103B, irrespective of whether these regions may be provided on different substrates or on the same substrate 101, may be determined on the basis of well-established Raman measurements in which a shift of spectral components may be used for determining internal strain levels.

Figure 1B:
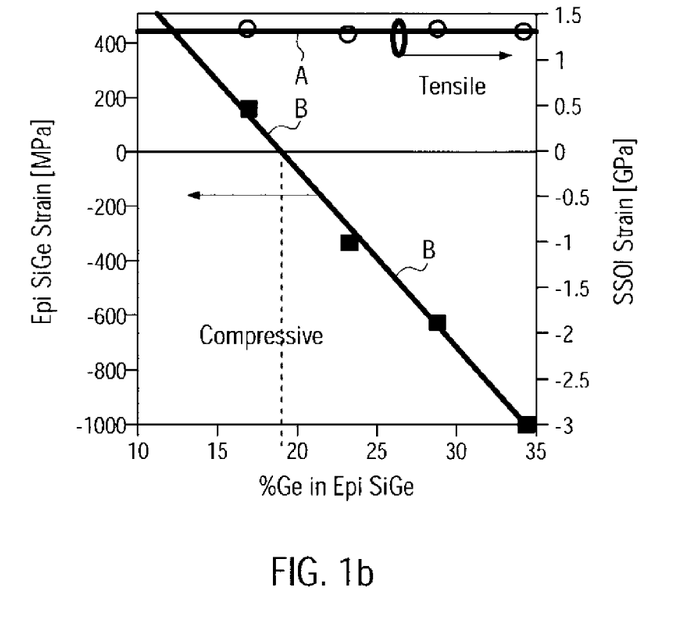

FIG. 1b schematically illustrates a graph that represents experimental data obtained from the semiconductor device 100. The vertical axis on the left-hand side of FIG. 1b represents the strain level of the plurality of regions 103A, 103B, while the horizontal axis represents the different germanium fractions in the silicon/germanium mixtures 103A . . . 103B. Furthermore, the vertical axis on the right-hand side represents the internal strain level of the silicon layer 102. As shown, curve A in FIG. 1b represents measurement data for different germanium concentrations in the regions 103A . . . 103B. For instance, for germanium concentrations of approximately 17 percent, 23 percent, 29 percent and 34 percent, an internal strain level of approximately 1.4 GPa has been determined for the silicon layer 102, wherein this internal strain level may not be substantially modified by the varying germanium concentration of the respective silicon/germanium mixtures 103A . . . 103B. It should be appreciated that the respective internal strain levels of the layer 102 have been determined at positions corresponding to locations of the regions 103A . . . 103B. For instance, a plurality of different substrates 101 may have been prepared with identical silicon layers having the same internal strain level, wherein a silicon/germanium layer has been formed above the layer 102 by epitaxial growth on the basis of a desired germanium concentration. Thus, as demonstrated by curve A, the internal strain level of the silicon layer 102 may be constant, irrespective of the strain level of the overlying silicon/germanium mixture.

On the other hand, curve B, representing the progression of the internal strain level of the regions 103A . . . 103B for the above-specified germanium concentrations, indicates a substantially linear dependence on the germanium fraction, wherein, for instance, a substantially neutral strain behavior may be obtained for a germanium concentration of approximately 18 percent. As will be explained later on, the silicon layer 102 may be formed on the basis of a relaxed silicon/germanium layer having a germanium concentration of approximately 20 percent. In this case, the germanium concentration in the regions 103A . . . 103B may be nearly the same as in the strain-inducing relaxed silicon/germanium material for achieving a substantially non-strained silicon/germanium lattice in the regions 103A . . . 103B, while a lower germanium concentration results in an increased lattice constant compared to the natural lattice constant corresponding to this lower germanium concentration. On the other hand, an increased germanium concentration results in a compressive state, since a corresponding natural silicon/germanium mixture of this increased germanium concentration would have a greater lattice constant compared to the strained lattice constant of the silicon layer 102, which in turn may substantially correspond to the natural lattice constant of the underlying silicon/germanium layer (not shown). It should be appreciated, however, that the internal strain level of the layer 102 may be generated by any other appropriate means, wherein the respective internal strain level may then be "mapped" into an appropriate germanium fraction so as to obtain a substantially neutral strain level in the silicon/germanium mixture, from which an appropriate germanium fraction may then be determined to obtain the desired internal strain level, such as tensile or compressive, depending on the desired device characteristics.

Thus, as indicated by curve B, for an internal strain level of the silicon layer 102 of approximately 1.4 GPa, a germanium concentration of approximately 10 percent may result in approximately 500 MPa internal tensile strain, while substantially not negatively affecting the overall tensile strain in the silicon layer 102. For example, on the left-hand side with respect to the neutral germanium concentration, the advantages obtained by a per se enhanced electron mobility of silicon/germanium material may additionally be combined with a moderately high internal tensile strain, thereby even further enhancing the overall electron mobility, which may finally result in a significantly enhanced overall performance of N-channel transistors, as previously explained. On the other hand, if desired, a certain amount of compressive strain may be created, for instance in portions of drain and source regions of P-channel transistors, if a compressive strain component is desired in the channel region thereof. Consequently, the transistor performance may be adapted in a highly local manner, even if a global internal tensile strain may be provided in the silicon layer 102.

Thus, with reference to FIGS. 1c-1h, further illustrative embodiments will now be described in which the concept of strain adaptation on the basis of a germanium concentration may be applied to a plurality of transistor configurations.

Figure 1C:
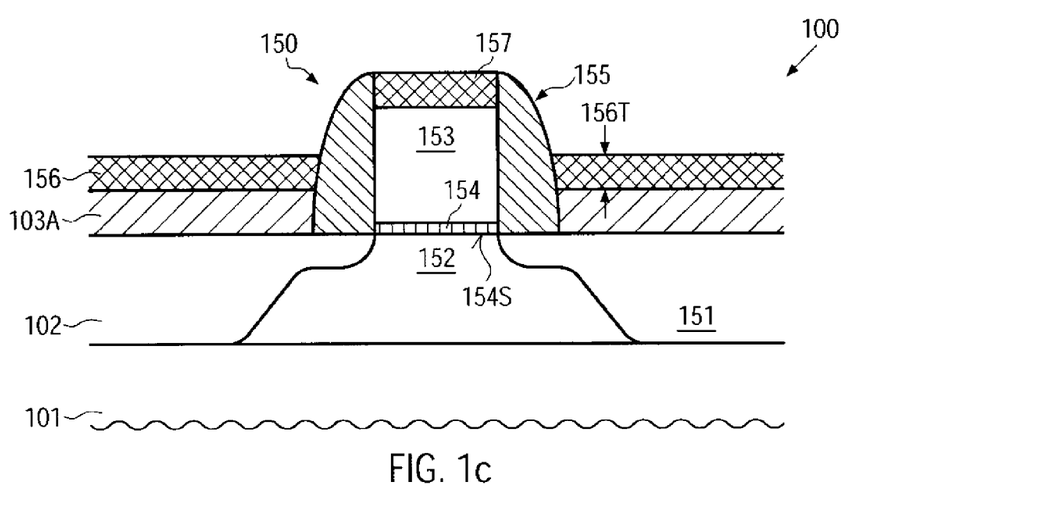
FIG. 1c schematically illustrates a cross-sectional view of an N-channel transistor formed on the basis of a highly tensilely strained semiconductor material, wherein a raised drain and source configuration is provided on the basis of a silicon/germanium mixture according to illustrative embodiments.

FIG. 1c schematically illustrates a cross-sectional view of the semiconductor device 100 according to further illustrative embodiments, in which a transistor element may be formed on the basis of a silicon/germanium mixture, such as the mixture 103A, which may exhibit a certain internal tensile strain, as previously discussed with reference to FIGS. 1a-1b. The semiconductor device 100 comprises the substrate 101 and the silicon-containing layer 102, wherein, in some illustrative embodiments, the layer 102 is to be understood as a silicon layer which may have incorporated therein other components, such as dopants for defining a desired conductivity profile in the layer 102 or at least portions thereof, other alloy-forming components, such as carbon, tin and the like, to adjust the overall lattice constant in the layer 102, wherein it should be appreciated that the substantial portion of the layer 102 may be comprised of silicon. The semiconductor layer 102 may be in a strained tensile state, that is, the lattice constant of the silicon-based material of the layer 102 has an increased lattice constant compared to its natural or relaxed state. For this purpose, the silicon-based layer 102 may be formed on an appropriate material layer, such as a dielectric, as will be explained later on, or on a different semiconductor material, such as a silicon/germanium material, a silicon/tin material and the like, in order to obtain the desired degree of tensile strain in the silicon-based layer 102. Furthermore, the semiconductor device 100 may comprise an N-channel transistor 150 which may be formed in and above a portion of the semiconductor layer 102. The transistor 150 may comprise a gate electrode structure 153 which may be comprised of any appropriate material, such as polysilicon, metal silicide and the like, depending on the overall characteristics of the device 100. The gate electrode structure 153 may be formed on a gate insulation layer 154, which may be comprised of silicon dioxide, silicon nitride, a combination thereof, or any appropriate high-k dielectric material, possibly in combination with one or more of the conventional dielectrics mentioned before. In this respect, a high-k dielectric material may be understood as a dielectric material having a relative permittivity of approximately 10 or higher.

Furthermore, depending on the overall device configuration, a sidewall spacer structure 155 may be formed on sidewalls of the gate electrode structure 153. Moreover, drain and source regions 151 are formed in the semiconductor layer 102, thereby defining a lateral and vertical dopant profile to provide appropriately shaped and configured PN junctions with a channel region 152 as required for the transistor performance. It should be appreciated that, due to the internal strain level of the layer 102, the channel region 152 may represent a substantially silicon-based region having a high degree of internal tensile strain, thereby providing enhanced electron mobility, as previously explained. Furthermore, the transistor 150 as shown in FIG. 1c may represent a transistor having a raised drain and source configuration, i.e., crystalline material may extend above a height level that is substantially defined by the gate insulation layer 154, i.e., a bottom surface 154S thereof. That is, the silicon/germanium mixture 103A may be formed on the silicon-based drain and source regions 151, wherein the mixture 103A may also comprise a moderately high dopant concentration to enhance the overall conductivity thereof. As previously explained, the mixture 103A may comprise an appropriate fraction of germanium to maintain a desired amount of tensile strain level therein in order to further enhance the overall electron mobility and thus conductivity therein. Furthermore, the transistor 150 may comprise metal silicide regions 156 connecting to the drain and source regions 151 via the silicon/germanium mixture 103A, which may also represent a portion of the drain and source regions 151, wherein the combination of the metal silicide regions 156, the mixture 103A and the regions 151 may define the raised drain and source configuration. In some illustrative embodiments, a respective metal silicide region 157 may also be provided in the gate electrode structure 153. It should be appreciated that, due to the raised drain and source configuration, a thickness 156T of the metal silicide regions 156 may be adjusted to reduce the overall contact resistance of the transistor 150, while a vertical and lateral extension of the metal silicide regions 156 is not critical and may be greater compared to a substantially planar transistor configuration. Consequently, in combination with the increased thickness 156T and the overall enhanced conductivity of the region 103A, the series resistance of the transistor 150 in the drain and source regions may be reduced, thereby providing overall enhanced transistor characteristics.

The semiconductor device 100 as shown in FIG. 1c may be formed on the basis of the following processes. After providing the substrate 101 having formed thereon the tensile silicon-based layer 102, which may be obtained on the basis of an epitaxial growth technique on a relaxed template layer, as previously explained, or by wafer bond techniques, as will be described later on, the gate electrode structure 153 and the gate insulation layer 154 may be formed on the basis of well-established process techniques. Thereafter, the dopant profile for the drain and source regions 151 may, at least partially, be defined by ion implantation to obtain a shallow PN junction in the vicinity of the channel region 152 on the basis of well-established implantation techniques, wherein the spacer structure 155 may be formed with an appropriate thickness, for instance, by providing a respective offset spacer (not shown). It should be appreciated that other implantation processes may be performed, for instance to amorphize a portion of the layer 102 and/or to provide a halo region for adjusting the dopant concentration gradient at the respective PN junctions in an appropriate manner. Next, the spacer structure 155 may be formed with a required width and thereafter the mixture 103A may be formed by selective epitaxial growth techniques using well-established recipes, wherein, however, a germanium concentration may be selected on the basis of concepts previously described with reference to FIGS. 1a-1b. In this case, the gate electrode structure 153 may also be covered by an appropriate cap layer, which may, for instance, be provided prior to actually patterning the gate electrode structure 153.

In other illustrative embodiments, the mixture 103A may be formed at an earlier manufacturing stage by providing an appropriate spacer structure and a cap layer for the gate electrode structure 153, wherein these components may be removed in a later stage and thereafter the dopant profiles in the drain and source regions 151 may be obtained on the basis of respective ion implantation techniques. In some illustrative embodiments, the mixture 103A may be formed prior to implanting dopant species into the regions 151, wherein a desired high dopant concentration in the mixture 103A may be obtained by an intrinsic doping of the mixture 103A during the selective epitaxial growth process. In other cases, a substantially intrinsic silicon/germanium material may be deposited, for instance, prior to actually defining deep drain and source regions, and thereafter the material 103A and portions of the layer 102 not covered by the spacer structure 155 may be commonly doped by ion implantation. The implantation processes may be followed by an appropriate anneal process to activate the dopants and re-crystallize implantation-induced damage. Thereafter, the metal silicide regions 156, possibly in combination with the region 157, may be formed by depositing an appropriate refractory metal, such as nickel, cobalt, platinum and the like, and initiating a chemical reaction with the underlying semiconductor material. In some illustrative embodiments, if the presence of germanium species may be considered inappropriate for forming the metal silicide regions 156, a respective silicon portion (not shown) may be formed above the mixture 103A with an appropriate thickness so as to be consumed during the silicidation process.

Consequently, an increased thickness 156T of metal silicide and the per se increased electron mobility combined with a moderately high tensile strain level in the mixture 103A may thus result in an overall enhanced performance of the N-channel transistor 150. For instance, with an internal strain level of the silicon-based semiconductor layer 102 of approximately 1-1.5 GPa, a germanium concentration of approximately 5-15 percent in the mixture 103A may provide enhanced transistor performance, where an appropriate performance enhancement may be readily adjusted by selecting a desired concentration of germanium in the mixture 103A.

Figure 1D:
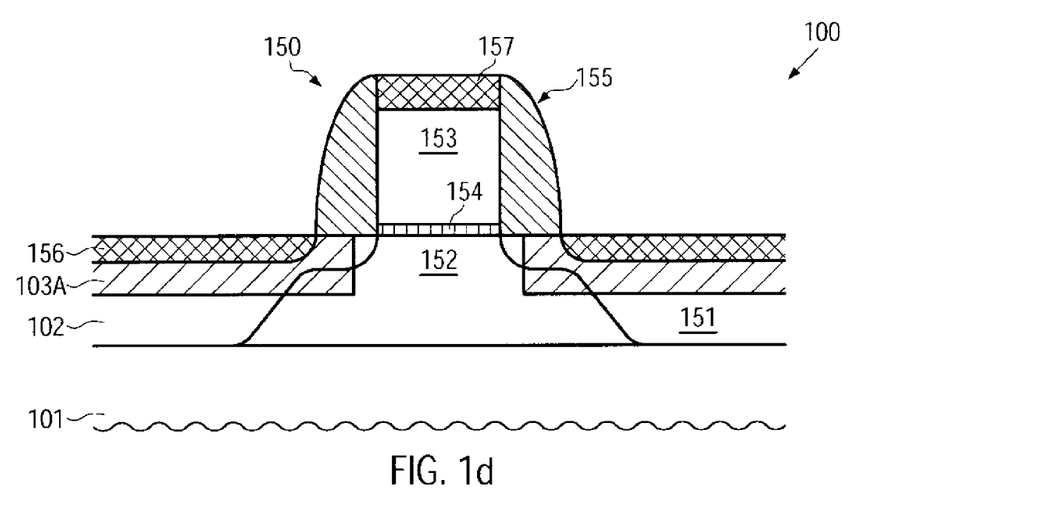
FIG. 1d schematically illustrates a cross-sectional view of an N-channel transistor comprising embedded silicon/germanium material of tensile strain, which may be formed in a tensile silicon material according to still further illustrative embodiments.

FIG. 1d schematically illustrates the semiconductor device 100 according to a further illustrative embodiment in which the transistor 150 has a substantially planar configuration. As shown, the silicon/germanium mixture 103A may be formed, at least partially, within the drain and source regions 151 with an internal tensile strain level adjusted on the basis of the germanium concentration as described above. Thus, also in this case, the overall conductivity of the drain and source regions 151 may be enhanced due to the increased electron mobility of silicon/germanium material in combination with the moderately high strain level in the mixture 103A, which may even provide a certain uniaxial strain component along the channel length direction, i.e., in FIG. 1d, the horizontal direction, in addition to the initial high biaxial strain component. Consequently, also in this configuration, a significant enhancement of transistor performance may be obtained, wherein again the overall characteristics may be efficiently adjusted with respect to the basic strain in the layer 102 by selecting an appropriate germanium concentration in the mixture 103A.

The mixture 103A may be efficiently embedded into the drain and source regions 151 by forming a recess in the layer 102 after the patterning of the gate electrode structure 153, for instance, on the basis of an appropriately sized spacer structure (not shown) and an appropriate cap layer for the gate electrode 153. Thereafter, the recess may be filled by selective epitaxial growth techniques so as to obtain a substantially planar configuration. It should be appreciated that, depending on the process strategies, the etch process for forming respective recesses may include the masking of other device regions in which respective recesses may not be desired.

Figure 1E:
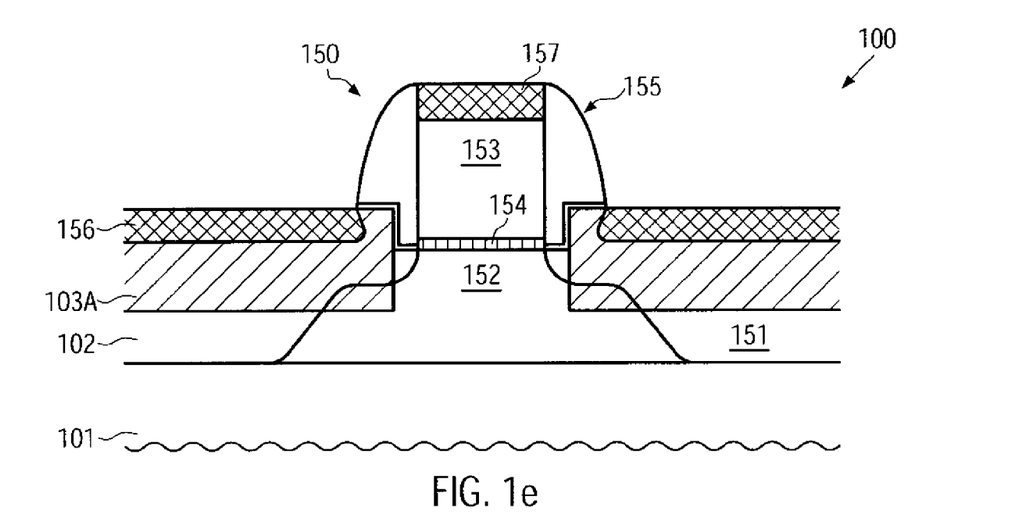
FIG. 1e schematically illustrates a cross-sectional view of an N-channel transistor having a raised drain and source configuration formed on the basis of a silicon/germanium mixture having an internal germanium concentration so as to maintain an internal tensile strain according to still further illustrative embodiments.

FIG. 1e schematically illustrates the semiconductor device 100 according to further illustrative embodiments, in which a raised drain and source configuration is provided, wherein, however, contrary to the configuration as shown in FIG. 1c, the silicon/germanium mixture 103A may extend into the semiconductor layer 102, thereby providing a reduced overall contact resistance since the metal silicide regions 156 may be provided with increased thickness, while also a significant portion of the drain and source regions 151 may have the increased electron mobility due to the internal tensile strain and the moderately high amount of germanium concentration, which may be in the range of approximately 5-15 percent, as previously explained.

The semiconductor device 100 as shown in FIG. 1e may be formed on the basis of the following processes. After patterning of the gate electrode structure 153, which may include a cap layer, a recess may be formed on the basis of an appropriately defined offset spacer (not shown), wherein, in the subsequent selective epitaxial growth process, a desired degree of overfilling may be provided. Prior to or after the selective epitaxial growth process, respective extension regions, i.e., shallow PN junctions, may be formed by ion implantation and thereafter the spacer structure 155 may be formed in accordance with device requirements, as previously explained. Thus, the transistor 150 of FIG. 1e may combine enhanced contact resistance on the basis of a moderately thick metal silicide region 156, while also providing reduced series resistance across a significant portion of the vertical extension of the drain and source regions 151, as previously explained with reference to FIG. 1b.

Figure 1F:
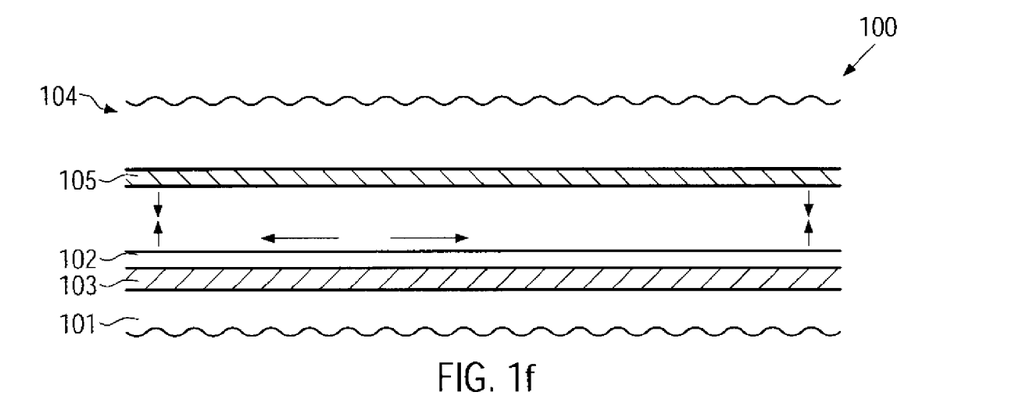
FIGS. 1f-1g schematically illustrate a manufacturing strategy for forming a highly strained semiconductor material on the basis of a relaxed silicon/germanium layer by wafer bonding.

FIG. 1f schematically illustrates the semiconductor device 100 during an initial manufacturing stage according to illustrative embodiments. In one illustrative embodiment, the substrate 101 may have formed thereon a semiconductor layer 103 having a greater lattice constant compared to relaxed silicon material. For example, the semiconductor material 103 may be comprised of relaxed silicon/germanium, relaxed silicon/tin, relaxed silicon/germanium/tin and the like. Furthermore, the silicon-based layer 102, which may be substantially comprised of silicon, may be formed on the relaxed semiconductor layer 103, thereby imparting a specific degree of internal tensile strain to the silicon layer 102. Thus, by appropriately adjusting the lattice mismatch between the layers 103 and 102, a desired high tensile strain may be adjusted, as is also previously explained. Thus, in some illustrative embodiments, the substrate 101 comprising the layers 103 and 102 may be used for the formation of the transistor elements 150, as described above. In this case, the germanium concentration of the mixture 103A may be selected on the basis of the internal strain level of the silicon layer 102, wherein a germanium concentration for obtaining a substantially neutral strain level in the mixture 103A may be determined on the basis of a germanium concentration of the layer 103, when representing a relaxed silicon/germanium material, or the internal strain level of the layer 102 may be measured and an appropriate germanium concentration may then be determined on the basis of experimental data, as for instance described with reference to FIGS. 1a-1b.

In other illustrative embodiments, the semiconductor device 100 may comprise, in this manufacturing stage, a carrier substrate 104, which may have formed thereon, at least on the surface thereof, an appropriate dielectric material 105, such as silicon dioxide. In this case, the substrates 104 and 101 may be joined via the layers 102 and 105 by means of well-established wafer bond techniques. Thereafter, the substrate 101 and the semiconductor material 103 may be removed, for instance, by defining a cleavage plane in the layer 102, which may, for instance, be accomplished on the basis of an implanted species, such as hydrogen, helium and the like. For this purpose, well-established implantation and wafer cleavage techniques may be used.

Figure 1G:
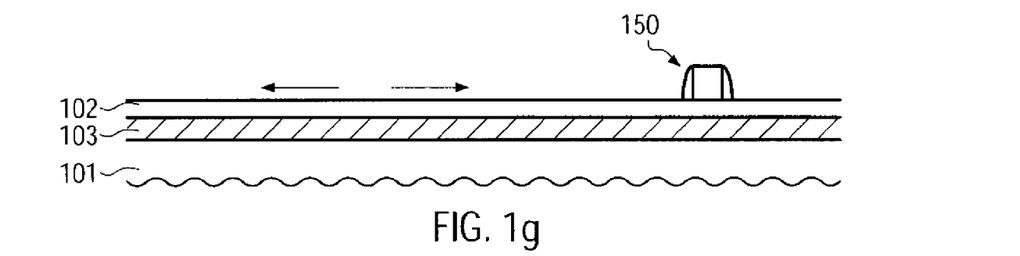

FIG. 1g schematically illustrates the semiconductor device 100 in a further advanced manufacturing stage, wherein now the carrier substrate 104, the dielectric material 105 and the silicon layer 102 may define an SOI configuration wherein, due to the previous wafer bonding process, the high internal strain level of the layer 102, when provided above the substrate 101, may be substantially preserved thereby providing the desired highly strained semiconductor material for the formation of respective transistor elements, such as the transistor elements 150, as previously described.

Figure 1H:
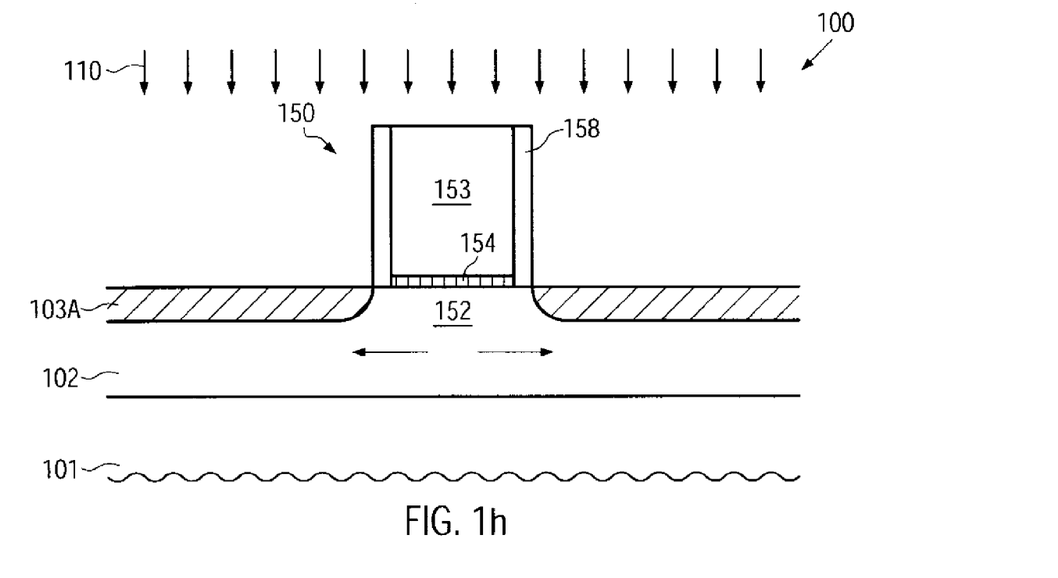
FIG. 1h schematically illustrates an N-channel transistor in a manufacturing stage, in which germanium may be incorporated by ion implantation, according to still further illustrative embodiments.

FIG. 1h schematically illustrates the semiconductor device 100 according to further illustrative embodiments in which, additionally or alternatively to a selective epitaxial growth process, the germanium concentration of the mixture 103A may be defined on the basis of an implantation process 110. For this purpose, the implantation process 110 may be performed at any appropriate manufacturing stage, for instance, after the patterning of the gate electrode structure 153, which may, for instance, include appropriately sized offset spacers 158 so that germanium may be incorporated into the layer 102 with a desired lateral offset with respect to the channel region 152, wherein the implantation parameters may be selected to obtain the desired concentration and penetration depth. Thereafter, in some illustrative embodiments, an appropriate dopant species may be introduced wherein the implantation 110 may provide a substantially pre-amorphized state of a portion of the semiconductor layer 102. The further processing may then be continued, as previously described, for instance with respect to the planar configuration as shown in FIG. 1d. In other illustrative embodiments, the implantation 110 may be performed in combination with selective epitaxial growth techniques, for instance, by providing different germanium concentrations in the regions 103A in different device areas. For example, in some illustrative embodiments, respective recesses may have been formed and may have been refilled during a selective epitaxial growth process on the basis of a specified germanium concentration. Thereafter, the germanium concentration may be increased in specific device areas by the implantation process 110, while masking other device areas, in which the initially selected epitaxially grown germanium concentration may be considered appropriate. In still other illustrative embodiments, a selective epitaxial growth process may be performed on the basis of a substantially planar configuration, while a germanium concentration thereof, as well as a specific penetration depth of a certain amount of germanium, may be adjusted on the basis of the implantation process 110. Similarly, the implantation process 110 may be performed in several steps, wherein a specific masking regime may provide different implantation doses at various device regions, thereby enabling an efficient adaptation of transistor characteristics in various device regions. For instance, if N-channel transistors of reduced leakage currents may be required, a reduced germanium concentration may be provided, while, in other areas, an enhanced germanium concentration may be considered appropriate for the performance of the respective N-channel transistors.

Figure 1I:
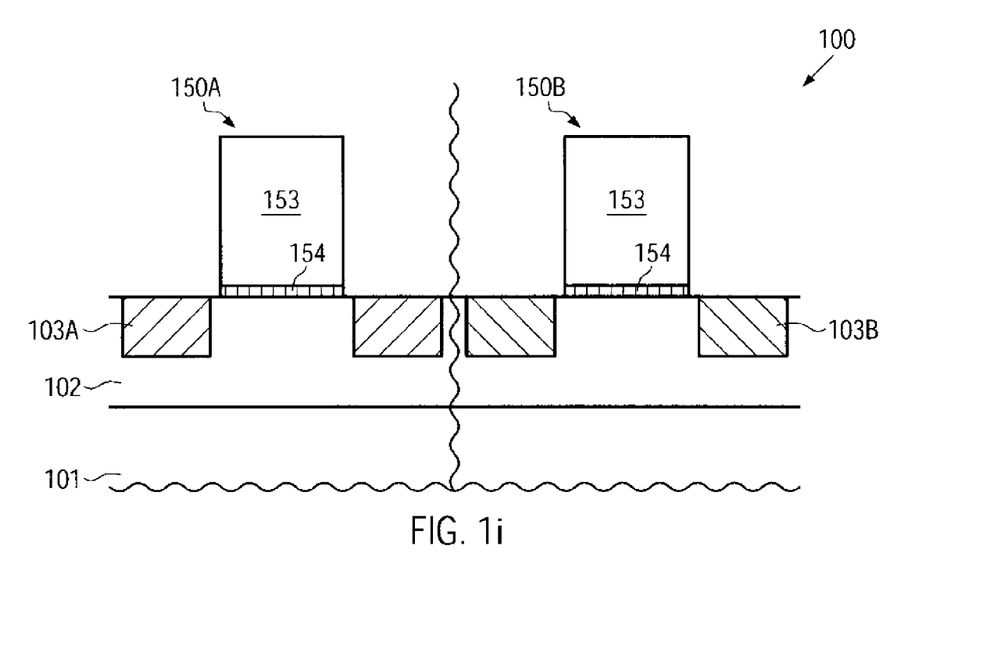
FIG. 1i schematically illustrates a cross-sectional view of a semiconductor device including a silicon-based semiconductor layer of high biaxial tensile strain and transistors of different conductivity type including silicon/germanium mixtures of different germanium concentration in order to individually adapt the transistor characteristics thereof, according to still further illustrative embodiments.

FIG. 1i schematically illustrates the semiconductor device 100 according to further illustrative embodiments in which a first transistor 150A and a second transistor 150B require a silicon/germanium mixture of different germanium concentration. For example, in the embodiment shown, the transistor 150A may represent an N-channel transistor, in a portion of which the mixture 103A may be provided. On the other hand, the transistor 150B may represent a P-channel transistor, in which a mixture 103B may be provided with an increased germanium concentration so as to obtain a specific uniaxial compressive strain component, which may result in increased performance of the transistor 150B. The semiconductor device 100 may be shown in an early manufacturing stage, that is, after creating respective recesses adjacent to the gate electrode structures 153 of the transistors 150A, 150B, followed by a first selective epitaxial growth process, for instance, designed to provide the mixture 103A appropriate for the transistor 150A. During this epitaxial growth process, the transistor 150B may be masked, for instance, on the basis of an appropriate dielectric material formed after patterning the recesses, which may then be selectively removed above the transistor 150A. For instance, a silicon dioxide layer, a silicon nitride layer and the like may be used for this purpose. Thereafter, the transistor 150A may be masked after the removal of the mask above the transistor 150B and the mixture 103B may be deposited on the basis of a desired higher germanium concentration. In other illustrative embodiments, a combination of implantation and selective epitaxial growth techniques may be used, as for instance described with the implantation process 110 (FIG. 1g), wherein a moderately high germanium concentration may be obtained on the basis of a selective epitaxial growth process, while a reduced germanium concentration may be obtained by ion implantation. Furthermore, it should be appreciated that the semiconductor device 100 as shown in FIG. 1i may also be provided with a raised drain and source configuration, as is for instance described with reference to FIGS. 1c and 1e.

As a result, performance of transistor elements may be enhanced by providing silicon/germanium material in combination with a silicon-based layer comprising a high internal tensile strain. For example, by providing a silicon/germanium material of reduced germanium concentration with respect to a strain neutral silicon/germanium mixture, electron mobility in the silicon/germanium material may further be increased, since a certain amount of internal tensile strain may nevertheless be maintained, which may enable an overall enhancement of conductivity of N-channel transistors. The tensilely strained silicon/germanium mixture may be embedded in the drain and source region on the basis of selective epitaxial growth techniques, ion implantation and the like, while using well-established process recipes, wherein raised drain and source configurations in which a silicon/germanium mixture may be provided above the strained silicon layer, a substantially planar configuration with embedded silicon/germanium material in the drain and source regions and any combinations thereof, may be efficiently provided. An appropriate germanium concentration may be readily selected by determining the initial strain level of the silicon-based semiconductor layer, which, in some illustrative embodiments, may be provided in the form of a strained silicon layer in an SOI configuration. Furthermore, the germanium concentration may be adjusted in a highly local manner, thereby providing a high degree of flexibility in individually adapting performance of transistors, such as N-channel transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a silicon-containing semiconductor layer above a substrate, said silicon-containing semiconductor layer having an internal tensile strain;
   forming a gate electrode structure for an N-channel transistor above a portion of said silicon-containing semiconductor layer;

forming a tensile silicon/germanium mixture laterally adjacent to said gate electrode structure of said N-channel transistor; and implanting germanium into a first portion of said tensile silicon/germanium mixture, the first portion having an increased germanium concentration relative to a second portion of said tensile silicon/germanium mixture.

2. The method of claim 1, wherein forming said tensile silicon/germanium mixture comprises determining a strain level of said silicon-containing semiconductor layer, determining an equivalent germanium fraction of a silicon/germanium mixture required for neutralizing said internal tensile strain and selecting a desired germanium fraction for said tensile silicon/germanium mixture on the basis of said equivalent germanium fraction.

3. The method of claim 2, wherein forming said tensile silicon/germanium mixture comprises epitaxially depositing silicon/germanium material on said silicon-containing semiconductor layer to form raised drain and source regions.

4. The method of claim 1, wherein forming said tensile silicon/germanium mixture comprises forming a recess adjacent to said gate electrode structure and filling said recess at least partially with said tensile silicon/germanium mixture.

5. The method of claim 4, further comprising overfilling said recess to form raised drain and source regions.

6. The method of claim 1, wherein forming said tensile silicon/germanium mixture comprises one of implanting germanium into a portion of said silicon-containing semiconductor layer or depositing a tensile silicon/germanium layer on said silicon containing semiconductor layer prior to implanting germanium into said first portion.

7. The method of claim 1, further comprising forming a compressive silicon/germanium mixture in a portion of said silicon-containing semiconductor layer and forming a P-channel transistor comprising said compressive silicon/germanium mixture.

8. The method of claim 1, wherein providing said silicon-containing semiconductor layer comprises forming strained silicon layer on a relaxed crystalline semiconductor layer formed above a first substrate, said relaxed crystalline layer having a greater lattice constant compared to natural silicon.

9. The method of claim 8, further comprising bonding said strained silicon layer to a second substrate and removing said relaxed crystalline semiconductor layer and said first substrate.

10. The method of claim 8, wherein said relaxed crystalline semiconductor layer is formed so as to comprise approximately 15-25 atomic percent germanium in a silicon-containing layer.

11. A method, comprising:
providing a silicon-containing semiconductor layer above a substrate, said silicon-containing semiconductor layer having an internal tensile strain;

forming a gate electrode structure for an N-channel transistor above a portion of said silicon-containing semiconductor layer; and forming a tensile silicon/germanium mixture laterally adjacent to said gate electrode structure of said N-channel transistor, wherein forming said tensile silicon/germanium mixture comprises determining a strain level of said silicon-containing semiconductor layer, determining an equivalent germanium fraction of a silicon/germanium mixture required for neutralizing said internal tensile strain and selecting a desired germanium fraction for said tensile silicon/germanium mixture on the basis of said equivalent germanium fraction.

12. The method of claim 11, wherein forming said tensile silicon/germanium mixture comprises epitaxially depositing silicon/germanium material on said silicon-containing semiconductor layer to form raised drain and source regions.

13. The method of claim 11, wherein forming said tensile silicon/germanium mixture comprises forming a recess adjacent to said gate electrode structure and filling said recess at least partially with said tensile silicon/germanium mixture.

14. The method of claim 13, further comprising overfilling said recess to form raised drain and source regions.

15. The method of claim 11, wherein forming said tensile silicon/germanium mixture comprises implanting germanium into a portion of said silicon-containing semiconductor layer.

16. The method of claim 11, further comprising forming a compressive silicon/germanium mixture in a portion of said silicon-containing semiconductor layer and forming a P-channel transistor comprising said compressive silicon/germanium mixture.

17. The method of claim 11, wherein providing said silicon-containing semiconductor layer comprises forming strained silicon layer on a relaxed crystalline semiconductor layer formed above a first substrate, said relaxed crystalline layer having a greater lattice constant compared to natural silicon.

18. The method of claim 17, further comprising bonding said strained silicon layer to a second substrate and removing said relaxed crystalline semiconductor layer and said first substrate.

19. The method of claim 17, wherein said relaxed crystalline semiconductor layer is formed so as to comprise approximately 15-25 atomic percent germanium in a silicon-containing layer.

20. A method, comprising:
providing a silicon-containing semiconductor layer above a substrate, said silicon-containing semiconductor layer having an internal tensile strain;

forming a gate electrode structure for an N-channel transistor above a portion of said silicon-containing semiconductor layer; and forming a tensile silicon/germanium mixture laterally adjacent to said gate electrode structure of said N-channel transistor, wherein providing said silicon-containing semiconductor layer comprises forming said strained silicon layer on a relaxed crystalline semiconductor layer formed above a first substrate, said relaxed crystalline layer having a greater lattice constant compared to natural silicon.

21. The method of claim 20, wherein forming said tensile silicon/germanium mixture comprises determining a strain level of said silicon-containing semiconductor layer, determining an equivalent germanium fraction of a silicon/germanium mixture required for neutralizing said internal tensile strain and selecting a desired germanium fraction for said tensile silicon/germanium mixture on the basis of said equivalent germanium fraction.

22. The method of claim 20, wherein forming said tensile silicon/germanium mixture comprises epitaxially depositing silicon/germanium material on said silicon-containing semiconductor layer to form raised drain and source regions.

23. The method of claim 20, wherein forming said tensile silicon/germanium mixture comprises forming a recess adjacent to said gate electrode structure and filling said recess at least partially with said tensile silicon/germanium mixture.

24. The method of claim 23, further comprising overfilling said recess to form raised drain and source regions.

25. The method of claim 20, wherein forming said tensile silicon/germanium mixture comprises implanting germanium into a portion of said silicon-containing semiconductor layer.

26. The method of claim 20, further comprising forming a compressive silicon/germanium mixture in a portion of said silicon-containing semiconductor layer and forming a P-channel transistor comprising said compressive silicon/germanium mixture.

27. The method of claim 20, further comprising bonding said strained silicon layer to a second substrate and removing said relaxed crystalline semiconductor layer and said first substrate.

28. The method of claim 20, wherein said relaxed crystalline semiconductor layer is formed so as to comprise approximately 15-25 atomic percent germanium in a silicon-containing layer.

* * * * *